US009728277B2

United States Patent
Lee et al.

(10) Patent No.: US 9,728,277 B2
(45) Date of Patent: Aug. 8, 2017

(54) METHOD OF REPAIRING NON-VOLATILE MEMORY BASED STORAGE DEVICE AND METHOD OF OPERATING ELECTRONIC SYSTEM INCLUDING THE STORAGE DEVICE

(71) Applicant: SAMSUNG ELECTRONICS CO., LTD., Suwon-si, Gyeonggi-Do (KR)

(72) Inventors: Joon Ho Lee, Hwaseong-si (KR); Jong Tae Park, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 84 days.

(21) Appl. No.: 14/813,420

(22) Filed: Jul. 30, 2015

(65) Prior Publication Data
US 2016/0042810 A1    Feb. 11, 2016

(30) Foreign Application Priority Data

Aug. 5, 2014    (KR) .................. 10-2014-0100550

(51) Int. Cl.
| | |
|---|---|
| *G06F 11/00* | (2006.01) |
| *G11C 29/44* | (2006.01) |
| *G11C 29/38* | (2006.01) |
| *G06F 11/07* | (2006.01) |
| *G06F 11/14* | (2006.01) |
| *G11C 29/00* | (2006.01) |
| *G11C 29/04* | (2006.01) |

(52) U.S. Cl.
CPC ...... *G11C 29/4401* (2013.01); *G06F 11/0748* (2013.01); *G06F 11/0793* (2013.01); *G06F 11/1417* (2013.01); *G11C 29/38* (2013.01); *G11C 29/702* (2013.01); *G11C 2029/0407* (2013.01)

(58) Field of Classification Search
CPC ............. G06F 11/0748; G06F 11/0793; G06F 11/1417
See application file for complete search history.

(56) References Cited

U.S. PATENT DOCUMENTS

| | | | | |
|---|---|---|---|---|
| 6,014,744 A | * | 1/2000 | McKaughan | ......... G06F 9/4401 713/100 |
| 7,679,133 B2 | | 3/2010 | Son et al. | |
| 7,991,946 B2 | | 8/2011 | Lee et al. | |
| 8,219,793 B2 | | 7/2012 | Park | |

(Continued)

FOREIGN PATENT DOCUMENTS

| | | |
|---|---|---|
| JP | 2008-176708 | 7/2008 |
| JP | 2010-272073 | 12/2010 |
| KR | 1020120050062 | 5/2012 |

*Primary Examiner* — Charles Ehne
(74) *Attorney, Agent, or Firm* — F. Chau & Associates, LLC.

(57) ABSTRACT

A method of repairing a storage device including a non-volatile memory includes powering on the storage device, performing a booting sequence, determining whether an error has occurred during the booting sequence or during a normal mode, writing a failure signature to a predetermined signature address in the non-volatile memory upon determining that the error has occurred, reporting a failure to a host upon writing the failure signature, entering into a repair mode upon reporting the failure, and operating in the normal mode upon determining that the error has not occurred.

19 Claims, 9 Drawing Sheets

(56) References Cited

U.S. PATENT DOCUMENTS

| | | |
|---|---|---|
| 8,553,466 B2 | 10/2013 | Han et al. |
| 8,559,235 B2 | 10/2013 | Yoon et al. |
| 8,654,587 B2 | 2/2014 | Yoon et al. |
| 2003/0070110 A1* | 4/2003 | Aija .................... G06F 11/1417 714/4.3 |
| 2003/0233558 A1* | 12/2003 | Lieberman ............ G06F 9/4416 713/189 |
| 2006/0136784 A1* | 6/2006 | Prescott .............. G06F 11/0748 714/38.11 |
| 2006/0271773 A1* | 11/2006 | Marquiz ............. G06F 11/2294 713/1 |
| 2008/0155332 A1* | 6/2008 | Landers .............. G06F 11/1417 714/36 |
| 2008/0209254 A1* | 8/2008 | Bailey ................. G06F 11/0727 714/2 |
| 2010/0115252 A1* | 5/2010 | Campbell ........... G06F 11/1415 713/1 |
| 2010/0185846 A1 | 7/2010 | Fukase |
| 2011/0191649 A1 | 8/2011 | Lim et al. |
| 2011/0233648 A1 | 9/2011 | Seol et al. |
| 2013/0166893 A1 | 6/2013 | Dusija et al. |
| 2013/0297985 A1 | 11/2013 | Yang |

\* cited by examiner

METHOD OF REPAIRING NON-VOLATILE MEMORY BASED STORAGE DEVICE AND METHOD OF OPERATING ELECTRONIC SYSTEM INCLUDING THE STORAGE DEVICE

CROSS-REFERENCE TO RELATED APPLICATIONS

This application claims priority under 3 U.S.C. §119 to Korean Patent Application No. 10-2014-0100550 filed on Aug. 5, 2014, the disclosure of which is incorporated by reference herein in its entirety.

TECHNICAL FIELD

Exemplary embodiments of the inventive concept relate to a storage device, and more particularly, to a non-volatile memory based storage device and a method of repairing the storage device.

DISCUSSION OF THE RELATED ART

With the increased use of storage devices such as secure digital (SD) cards and solid state drives (SSDs), the occurrence of errors increases. When a serious error occurs, such as, for example, failure to recognize a storage device, the user may need to visit a service center to have the storage device repaired. Having to visit a service center to repair a storage device is time-consuming and costly for the user, and causes an increase in customer service workload for the service center.

SUMMARY

Exemplary embodiments of the inventive concept provide a method of repairing a storage device including non-volatile memory.

According to an exemplary embodiment, a method of repairing a storage device including a non-volatile memory includes powering on the storage device, performing a booting sequence, determining whether an error has occurred during the booting sequence or during a normal mode, writing a failure signature to a predetermined signature address in the non-volatile memory upon determining that the error has occurred, reporting a failure to a host upon writing the failure signature, entering into a repair mode upon reporting the failure, and operating in the normal mode upon determining that the error has not occurred.

In an exemplary embodiment, performing the booting sequence includes executing a read-only memory (ROM) code that has been written to ROM, loading a firmware code from the non-volatile memory to random access memory (RAM), and reading flash translation layer (FTL) metadata from the non-volatile memory. Determining whether the error has occurred includes determining whether the error is present in the FTL metadata.

In an exemplary embodiment, entering into the repair mode includes receiving an FTL format command issued by a repair application program stored in the host, initializing the FTL metadata in response to receiving the FTL format command, and erasing the failure signature from the signature address.

In an exemplary embodiment, initializing the FTL metadata includes erasing at least one block including the FTL metadata, and generating and writing new initial metadata to a predetermined address.

In an exemplary embodiment, the FTL format command is one command from among a plurality of commands predefined in the repair application program, and the FTL command is a vendor specific command.

In an exemplary embodiment, the method further includes entering into the normal mode after erasing the failure signature.

In an exemplary embodiment, the error is determined to be present in the FTL metadata upon determining that the FTL metadata is not found at a predetermined address, that an uncorrectable error has occurred in the FTL metadata, that the FTL metadata has a checksum error, or that a number of free blocks in the FTL metadata is zero.

In an exemplary embodiment, the FTL metadata includes mapping data used to perform a mapping operation between a logical address and a physical address, an attribute of a memory block indicating whether the memory block is a log block or a free block, and the number of free blocks.

In an exemplary embodiment, the method further includes reading the failure signature or a success signature written to the predetermined signature address before loading the firmware code from the non-volatile memory to the RAM.

According to an exemplary embodiment of the inventive concept, a method of operating an electronic system capable of repairing a storage device using an application program includes powering on the storage device, receiving a failure report from the storage device upon an error occurring during a booting sequence of the storage device or during a normal mode, displaying a failure message to a user in response to receiving the failure report, issuing a user query to the user to determine whether to perform a repair operation, and issuing a device repair command to the storage device in response to the user query.

In an exemplary embodiment, the error occurs in flash translation layer (FTL) metadata and the device repair command includes an FTL format command.

In an exemplary embodiment, the FTL format command is one command from among a plurality of commands predefined in the application program, and the FTL format command is a vendor specific command.

In an exemplary embodiment, the method further includes issuing a user query to the user, before issuing the FTL command to the storage device, to determine whether to perform a data backup operation, and issuing a data backup command to the storage device in response to the user query.

In an exemplary embodiment, the method further includes writing a failure signature, by the storage device, to a predetermined signature address upon the error occurring in the FTL metadata.

In an exemplary embodiment, the method further includes initializing the FTL metadata, by the storage device, in response to the FTL format command, and erasing the failure signature from the predetermined signature address.

According to an exemplary embodiment of the inventive concept, a method of repairing a storage device including a non-volatile memory includes performing a booting sequence, determining whether an error has occurred during the booting sequence, erasing an existing failure signature from a signature address in the non-volatile memory upon determining that the error has not occurred, writing a normal signature to the signature address upon determining that the error has not occurred, writing a new failure signature to the signature address upon determining that the error has occurred, reporting a failure to a host upon writing the new failure signature, and entering into a repair mode upon reporting the new failure.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION OF THE EXEMPLARY EMBODIMENTS

Figure 1:
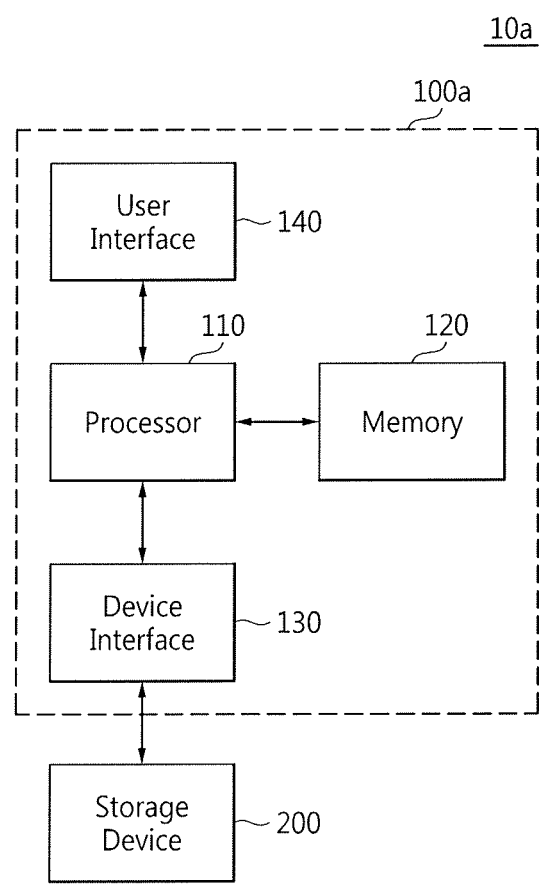
FIG. 1 is a block diagram of the connections of an electronic system according to an exemplary embodiment of the inventive concept.

Exemplary embodiments of the inventive concept now will be described more fully hereinafter with reference to the accompanying drawings. In the drawings, the size and relative sizes of layers and regions may be exaggerated for clarity. Like reference numerals may refer to like elements throughout.

It will be understood that when an element is referred to as being "connected" or "coupled" to another element, it can be directly connected or coupled to the other element or intervening elements may be present.

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the inventive concept.

Exemplary embodiments of the inventive concept provide a method of allowing a user to repair a failure in a non-volatile memory based storage device. For example, according to exemplary embodiments, an emergency repair function is given to an application program of a host, allowing a user to repair a storage device without having to visit a service center.

FIG. 1 is a block diagram of the connections of an electronic system 10a according to an exemplary embodiment of the inventive concept. The electronic system 10a includes a host 100a and a storage device 200.

The host 100a may execute an application program. For example, the host 100a may execute a repair application (e.g., repair application 102 in FIG. 3) that can detect an error/defect of the storage device 200 and provide an emergency repair function of the storage device 200. The storage device 200 may be purchased by a user. After the storage device 200 has been purchased, or while the storage device 200 is being used, an error (e.g., failure to recognize the storage device 200) may occur. Exemplary embodiments provide a method of allowing a user to repair such an error without having to visit a service center.

The host 100a includes a processor 110, a memory 120, a device interface 130, and a user interface 140.

The processor 110 may control the overall operation of the host 100a. The processor 110 may be implemented, for example, as a system-on-chip (SoC). The processor 110 may be, for example, a general purpose processor or a special purpose processor.

The memory 120 may be an operation memory of the processor 110. The memory may store codes and data driven by the processor 110. The memory 120 may include, for example, read-only memory (ROM) and random access memory (RAM). RAM may be formed with volatile RAM such as, for example, dynamic RAM (DRAM), static RAM (SRAM), or synchronous DRAM (SDRAM), or non-volatile RAM such as, for example, ferroelectric RAM (FRAM), phase-change RAM (PRAM), magnetic RAM (MRAM), or resistive RAM (RRAM).

The device interface 130 may facilitate communication between the processor 110 and the storage device 200. The device interface 130 may be integrated with the processor 110 to form a semiconductor integrated circuit (e.g., an SoC).

The storage device 200 may communicate with the processor 110 through the device interface 130. The storage device 200 may be accessed by the processor 110. The storage device 200 may be, for example, a non-volatile memory based storage device including non-volatile memory. The storage device 200 may include, for example, a storage device embedded in the host 100a (e.g., an embedded multimedia card (eMMC)) and a storage device removable from the host 100a (e.g., an SD card, an MMC, or a solid state drive (SSD)).

The user interface 140 may facilitate communication with a user according to the control of the processor 110. The user interface 140 may include user input interfaces such as, for example, a keyboard, a keypad, a button, a touch panel, a touch screen, a touch pad, a touch ball, a microphone, a sensor, etc. The user interface 140 may further include a device such as, for example, a liquid crystal display (LCD) device, a light emitting diode (LED) display device, an organic LED (OLED) display device, an active-matrix OLED (AMOLED) display device, or a speaker, which outputs information to a user.

The host 100a may include other elements in addition to the elements 110 through 140 illustrated in FIG. 1. For example, according to exemplary embodiments, the host 100a may further include a network device (e.g., a wireless network device or a wired network device) and a camera module. The network device may connect the electronic system 10a to a wired or wireless network. The camera module may convert an optical image to an electrical image.

The electronic system 10a may be implemented as, for example, a personal computer (PC), a data server, or a portable electronic device. The portable electronic device may be, for example, a laptop computer, a cellular phone, a smartphone, a tablet PC, a personal digital assistant (PDA), an enterprise digital assistant (EDA), a digital still camera (DSC), a digital video camera (DVC), a portable multimedia player (PMP), a personal navigation device or portable navigation device (PND), a handheld game console, an e-book, etc.

Figure 2:
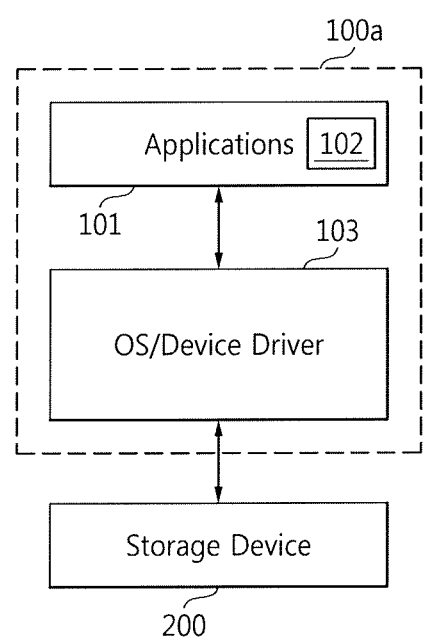
FIG. 2 is a schematic diagram of a software layer in the electronic system illustrated in FIG. 1 according to an exemplary embodiment of the inventive concept.

FIG. 2 is a schematic diagram of a software layer in the electronic system 10a illustrated in FIG. 1 according to an exemplary embodiment of the inventive concept. Referring to FIGS. 1 and 2, the software layer includes applications 101, an OS/device driver 103, and the storage device 200.

The applications 101 are application programs that can be installed in and executed by the host 100a. The applications 101 include the repair application 102.

The repair application 102 may recognize the storage device 200 connected to the host 100a, determine whether a defect is present in the storage device 200, and provide the emergency repair function when it is determined that a defect is present in the storage device 200.

An operating system (OS) in the OS/device driver 103 may be driven by the processor 110. The OS may manage resources (e.g., memory and computing power) of the electronic system 10a. The OS may distribute the resources to the applications 101. The OS may access hardware of the electronic system 10a at the request of the applications 101.

A device driver in the OS/device driver 103 may convert a hardware access request issued by the OS to a command that can be identified in hardware. For example, the OS may issue a logic command for resource management and the device driver may convert the logic command to a physical command.

The storage device 200 may be accessed by an instruction output from the OS/device driver 103. The storage device 200 may be manufactured according to standard storage device specifications (e.g., according to SD card, MMC, eMMC or SSD specifications). These specifications permit vendor specific commands as well as normal commands to be implemented. Normal commands may include, for example, standard commands such as a read command and a write command to perform common operations such as a read operation and a write operation. A vendor specific command is a command for which an operation is defined by a vendor or a manufacturer (e.g., a command not typically included among commonly performed normal commands).

According to exemplary embodiments of the inventive concept, a plurality of vendor specific operations such as, for example, a data backup operation and a flash translation layer (FTL) format operation, are defined to provide a method of repairing the storage device 200, and the vendor specific operations can be performed by the vendor specific commands.

The repair application 102 may issue a vendor specific command to the storage device 200 and may receive a vendor specific response (e.g., a failure report, as described in further detail below) from the storage device 200.

Figure 3:
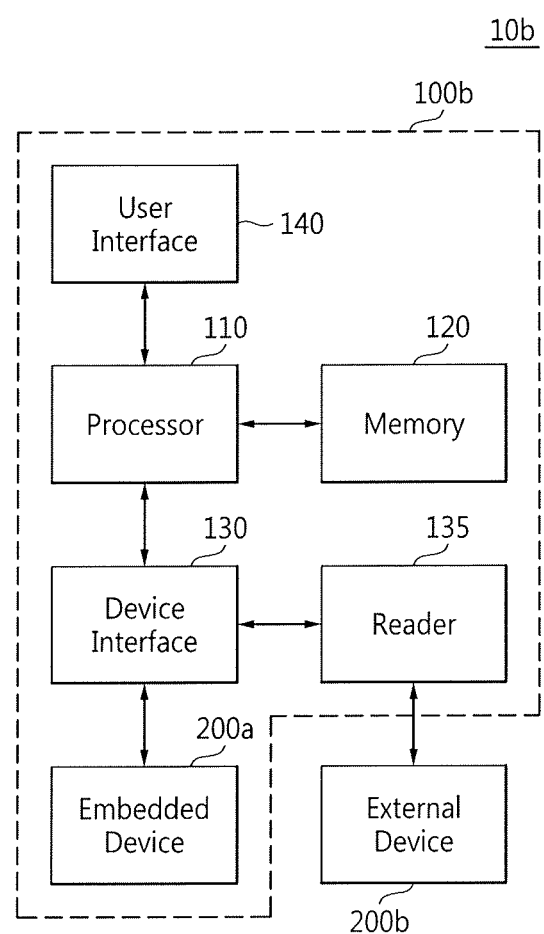
FIG. 3 is a block diagram of an electronic system according to an exemplary embodiment of the inventive concept.

FIG. 3 is a block diagram of an electronic system 10b according to an exemplary embodiment of the inventive concept. Referring to FIG. 3, the electronic system 10b includes a host 100b and an external storage device 200b.

The host 100b includes the processor 110, the memory 120, the device interface 130, the user interface 140, a reader 135, and an embedded storage device 200a. The structure and operations of elements of the electronic system 10b illustrated in FIG. 3 that have been previously described with reference to the electronic system 10a illustrated in FIG. 1 are similar. Thus, for convenience of explanation, an additional description of these elements and processes may be omitted herein.

Compared to the electronic system 10a illustrated in FIG. 1, the electronic system 10b illustrated in FIG. 3 further includes the reader 135. In addition, the electronic system 10b further includes both the embedded storage device 200a and the external storage device 200b.

The reader 135 may communicate with the processor 110 through the device interface 130. The reader 135 may control the external storage device 200b according to the control of the processor 110.

The external storage device 200b may communicate with the processor 110 through the reader 135 and the device interface 130. The reader 135 may communicate with the device interface 130 according to a predetermined communication protocol. For example, the reader 135 may communicate with the device interface 130 according to a universal serial bus (USB) protocol. However, it is to be understood that the inventive concept is not limited thereto.

Figure 4:
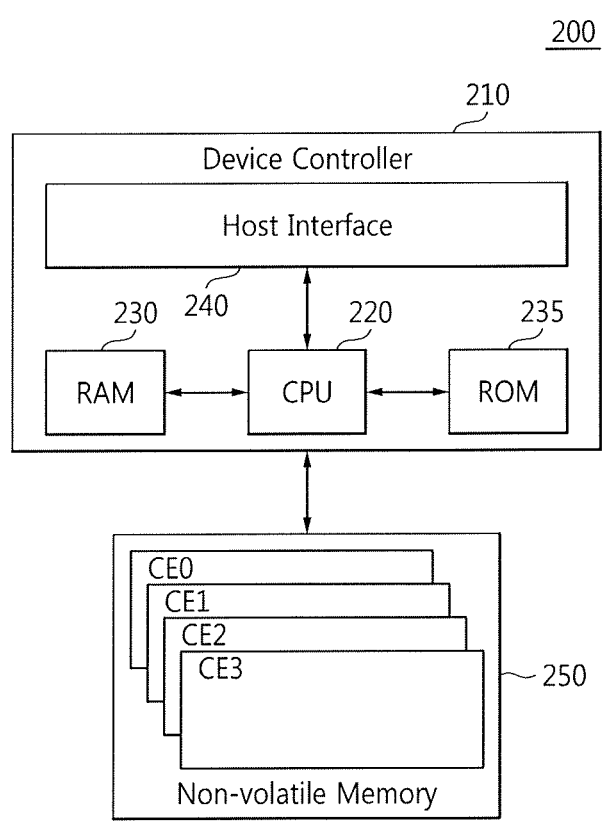
FIG. 4 is a schematic block diagram of a structure of a storage device according to an exemplary embodiment of the inventive concept.

FIG. 4 is a schematic block diagram of a structure of the storage device 200 according to an exemplary embodiment of the inventive concept. Referring to FIG. 4, the storage device 200 includes a device controller 210 and a non-volatile memory 250.

The device controller 210 controls data communication between the host 100a or 100b (hereinafter, generically denoted by reference numeral 100) and the non-volatile memory 250. The device controller 210 includes a central processing unit (CPU) 220, a RAM 230, a ROM 235, and a host interface 240.

The CPU 220 controls the overall operation of the storage device 200. The CPU 220 may access the non-volatile memory 250 in response to a command and an address received through the host interface 240.

The RAM 230 may be an operation memory of the CPU 220. The RAM 230 may be, for example, a buffer memory or a cache memory. The RAM 230 may include volatile or non-volatile RAM such as, for example, SRAM, DRAM, SDRAM, FRAM, PRAM, MRAM, or PRAM.

The ROM 235 may store a ROM code. The ROM code may be first executed when the storage device 200 is powered up.

The host interface 240 may facilitate communication with the host 100. For example, the host interface 240 may receive a command issued by the host 100, interpret the command, and generate a response according to the interpretation result. The host interface 240 may also receive data from or transmit data to the host 100 according to the command.

Herein, when referring to exemplary embodiments, it is assumed that the non-volatile memory 250 is a NAND flash memory. However, the inventive concept is not limited thereto. For example, in exemplary embodiments, the non-volatile memory 250 may include FRAM, PRAM, MRAM, RRAM, or EEPROM. The non-volatile memory 250 may include a plurality of memory elements CE0 through CE3.

The non-volatile memory 250 may further include a plurality of memory blocks.

In an exemplary embodiment of the present inventive concept, the non-volatile memory 250 may include a three dimensional (3D) memory array. The 3D memory array may be monolithically formed in one or more physical levels of arrays of memory cells having an active area disposed above a silicon substrate and circuitry associated with the operation of those memory cells. The circuitry may be disposed above or within the substrate. The term "monolithic" means that layers of each level of the array are directly deposited on the layers of each underlying level of the array.

In an exemplary embodiment of the present inventive concept, the 3D memory array includes vertical NAND strings that are vertically oriented such that at least one memory cell is located over another memory cell. The at least one memory cell may include a charge trap layer.

The following patent documents, which are hereby incorporated by reference, describe suitable configurations for three-dimensional memory arrays in which the three-dimensional memory array is configured as a plurality of levels with word lines and/or bit lines shared between levels: U.S. Pat. Nos. 7,679,133, 8,553,466, 8,654,587, and 8,559,235, and U.S. Pat. Pub. No. 2011/0233648.

The non-volatile memory 250 may be divided into a user area in which a user can write data to or read data from, and a non-user area which cannot be used by a user.

A predetermined signature, device firmware, and metadata (e.g., flash translation layer (FTL) metadata) may be stored in the non-user area. A device repair function may be implemented as a part of the device firmware. The predetermined signature may be a failure signature or a success signature, which is described in further detail below. Metadata is managed by the device controller 210 and is used to run the storage device 200. The metadata may include, for example, mapping data used to perform a mapping operation between a logical address and a physical address, an attribute of a memory block (e.g., data indicating whether a memory block is a log block or a free block), and information regarding the number of free memory blocks.

Errors may occur in the storage device 200 due to various reasons. For example, one such reason is that firmware may be defective due to a problem(s) that has occurred in a non-volatile memory region that stores the firmware (e.g., a firmware storage region in NAND flash memory). Another such reason is that an error may occur in FTL metadata even though the firmware is normally loaded. It is to be understood that these reasons are exemplary, and that errors may occur in the storage device 200 due to various other reasons.

An error(s) may occur in the storage device 200 while a booting sequence is being performed, or while the storage device 200 is operating in a normal mode (also referred to herein as a normal operation mode) after the booting sequence has been normally performed. As described above, when an error (e.g., an uncorrectable error) occurs in the storage device 200, the storage device 200 may be repaired using a method of repairing the storage device according to exemplary embodiments of the inventive concept.

Figure 5:
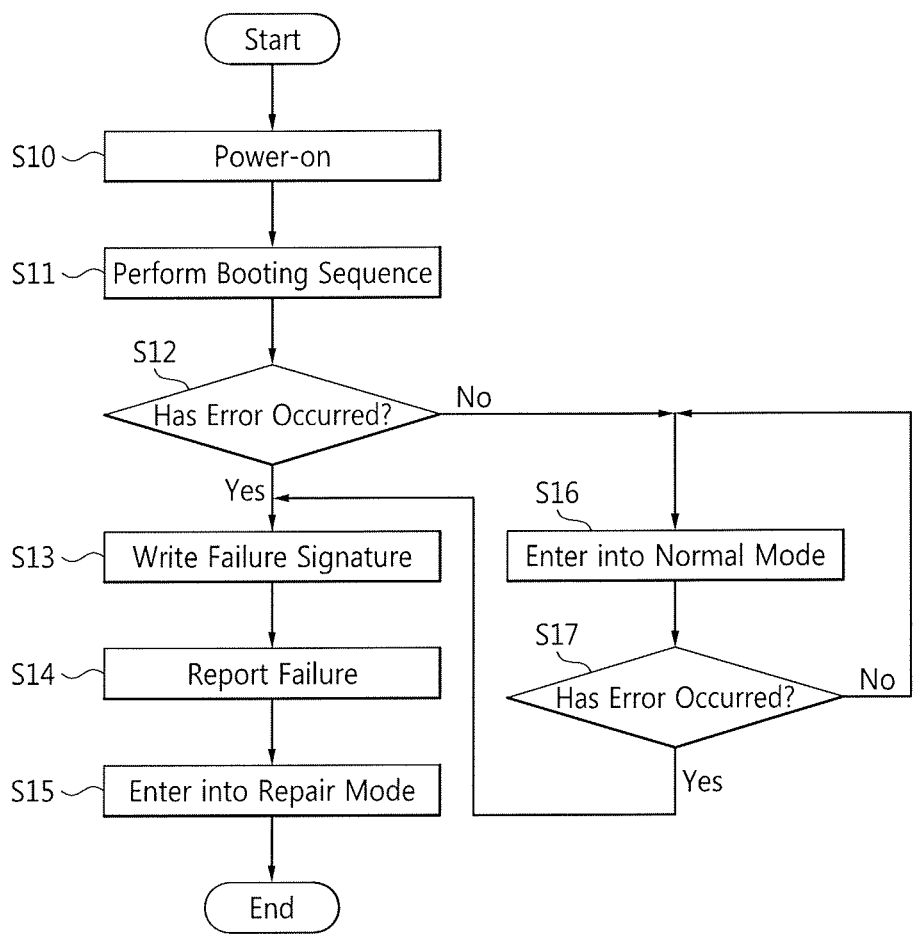
FIG. 5 is a schematic flowchart of a method of repairing a storage device according to an exemplary embodiment of the inventive concept.

FIG. 5 is a schematic flowchart of a method of repairing the storage device 200 according to an exemplary embodiment of the inventive concept. The storage device 200 is powered on in operation S10, and performs a booting sequence (e.g., a predetermined booting sequence) in operation S11. The booting sequence may include, for example, executing a ROM code, reading a signature, executing a firmware code, and reading metadata.

In operation S12, it is determined whether an error has occurred during the booting sequence. If it is determined that an error has occurred during the booting sequence in operation S12, a failure signature is written to a predetermined signature address in the non-volatile memory 250 in operation S13. The failure is reported to the host 100 in operation S14 and a repair mode is entered in operation S15.

If it is determined that an error has not occurred during the booting sequence in operation S12, a normal mode is entered into in operation S16. When it is determined that an error (e.g., an uncorrectable data error) has occurred in the storage device 200 while in the normal mode in operation S17, a failure signature is written to the predetermined signature address in the non-volatile memory 250 in operation S13. The failure is then reported to the host 100 in operation S14 and the repair mode is entered into in operation S15.

The repair mode is a mode in which the non-volatile memory 250 (e.g., a NAND memory 250) operates in response to only certain predetermined commands. For example, in an exemplary embodiment, during the repair mode, the non-volatile memory 250 only operates in response to a read command, a data backup command, and a repair command. Accordingly, some operations, including a write operation of the non-volatile memory 250, cannot be performed in the repair mode. That is, in exemplary embodiments, only data read and repair operations can be performed in the repair mode. The repair application 102 of the host 100 may read and back up data from the storage device 200 and may execute a device repair command. It is to be understood that the specific repair mode described herein is exemplary. For example, according to exemplary embodiments, the repair mode may correspond to other commands (e.g., commands other than a read command, a data backup command, and a repair command) that the non-volatile memory 250 operates in response to while in the repair mode.

Figure 6:
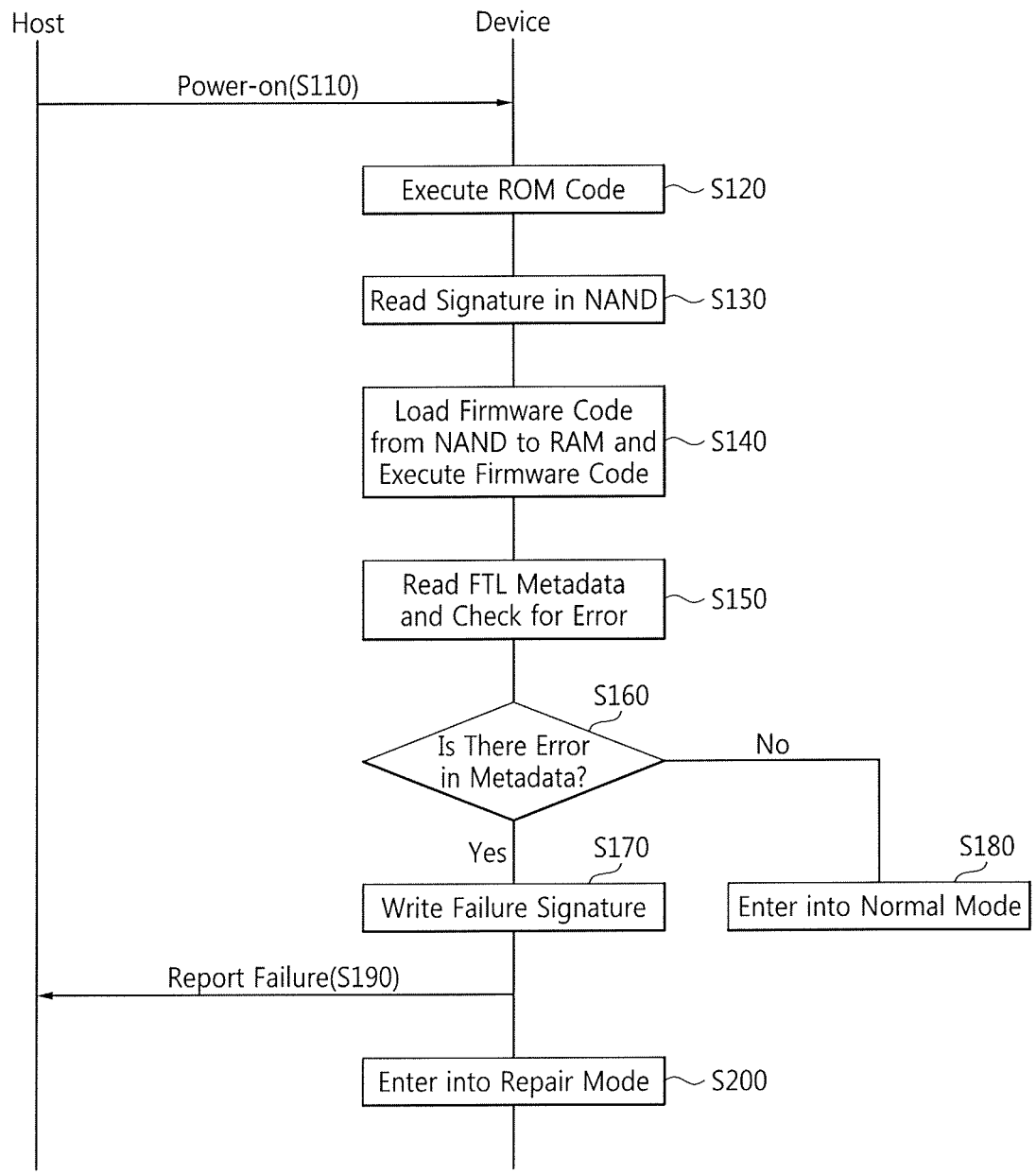
FIG. 6 is a flowchart of a method of repairing a storage device according to an exemplary embodiment of the inventive concept.

FIG. 6 is a flowchart of a method of repairing the storage device 200 according to an exemplary embodiment of the inventive concept. The method illustrated in FIG. 6 may be performed by the electronic system 10a or 10b (hereinafter, generically denoted by reference numeral 10) illustrated in FIGS. 1 and 3.

Referring to FIG. 6, the storage device 200 is powered on in operation S110. Once the storage device 200 has been powered on, a ROM code stored in the ROM 235 in the storage device 200 is executed in operation S120. When the ROM code is executed, a signature written to a predetermined address (hereinafter referred to as a "signature address") in the non-volatile memory 250 (e.g., a NAND memory 250) is read in operation S130. The signature address is defined in advance to record a failure signature. When an error occurs during booting of the storage device 200, a failure signature indicating that an error(s) has occurred is written to the signature address. When booting is performed normally, a normal signature is written to the signature address, or if the failure signature has previously been written to the signature address, the failure signature is cancelled (e.g., erased from the signature address).

After the signature is read, a firmware code that has been stored in a predetermined region of the non-volatile memory 250 is loaded to the RAM 230 and then executed in operation S140. When the firmware code runs in the RAM 230 normally, the first task that may be performed is searching for FTL metadata in the non-volatile memory 250. Thus, in operation S150, the FTL metadata may be searched for and read from the non-volatile memory 250, and the FTL metadata may be checked for an error.

When the FTL metadata is not found in the non-volatile memory 250, the storage device 200 cannot perform a normal operation. For example, when the FTL metadata is not found at a predetermined address of the non-volatile memory 250, when an error (e.g., an uncorrectable error) occurs in the FTL metadata, or when a checksum error occurs in the FTL metadata, it is determined that there is an error in the metadata at operation S160. In addition, when the number of free blocks in the metadata that has been read is zero, it may also be determined that there is an error in the metadata at operation S160.

When it is determined that there is an error in the metadata in operation S160, a failure signature is written to a predetermined signature address of the non-volatile memory 250 in operation S170. When it is determined that there is not an error in the metadata in operation S160, the normal mode is entered into in operation S180.

The normal mode is a mode in which the non-volatile memory 250 performs a normal operation (e.g., the normal mode is a mode in which the non-volatile memory 250 operates in while not operating in the repair mode). In the normal mode, a read operation for reading data from the non-volatile memory 250, a write operation for writing data to the non-volatile memory 250, and an erase operation for erasing data from the non-volatile memory 250 are all performed normally. Thus, the normal mode and the repair mode may be distinguished from each other based on whether the non-volatile memory 250 is permitted to perform all operations typically performed by a memory device (in which case the non-volatile memory 250 is operating in the normal mode), or whether the non-volatile memory 250 is permitted to operate in response to only certain predetermined commands (in which case the non-volatile memory 250 is operating in the repair mode).

While the failure signature is being written to the non-volatile memory 250 or after the failure signature has been written to the non-volatile memory 250 (see operation S170), the storage device 200 reports the failure to the host 100 in operation S190. The storage device 200 enters into the repair mode in operation S200. The failure report is transmitted to the repair application 102 through the OS/device driver 103 in the host 100.

The storage device 200 may perform predetermined repairing operations in the repair mode in response to a device repair command issued by the repair application 102 of the host 100. The repairing operations may include, for example, erasing existing metadata and creating and writing new initial metadata, however, it is to be understood that the inventive concept is not limited to these examples.

When an uncorrectable error occurs in the storage device 200, the storage device 200 may enter into a read-only mode. Only data reading is permitted in the read-only mode. Therefore, in the read-only mode, the storage device 200 does not execute any command other than a data read command. A user is permitted to back up data using the data read command. A data backup command and a device repair command (e.g., an FTL format command) may be vendor specific commands predefined to execute special operations such as, for example, a data backup operation and an FTL format operation.

According to exemplary embodiments of the inventive concept, the electronic system 10 may issue a vendor specific command using a normal command and an address. For example, the repair application 102 driven in the electronic system 10 may select a normal command and an address corresponding to a selected special operation, such as a data backup operation or an FTL format operation, according to predetermined rules. The normal command is a command that is defined for a normal operation (e.g., a read operation, a write operation, or an erase operation) of the storage device 200 in the standard or specification of the storage device 200.

The repair application 102 may issue the data backup command or the FTL format command to the storage device 200 by issuing the selected normal command and address. The CPU 220 may receive the normal command and address through the host interface 240 and may access the non-volatile memory 250 based on the normal command and address. When the repair application 102 receives the failure report from the storage device 200, the repair application recognizes that the storage device 200 has entered into the repair mode.

Figure 7:
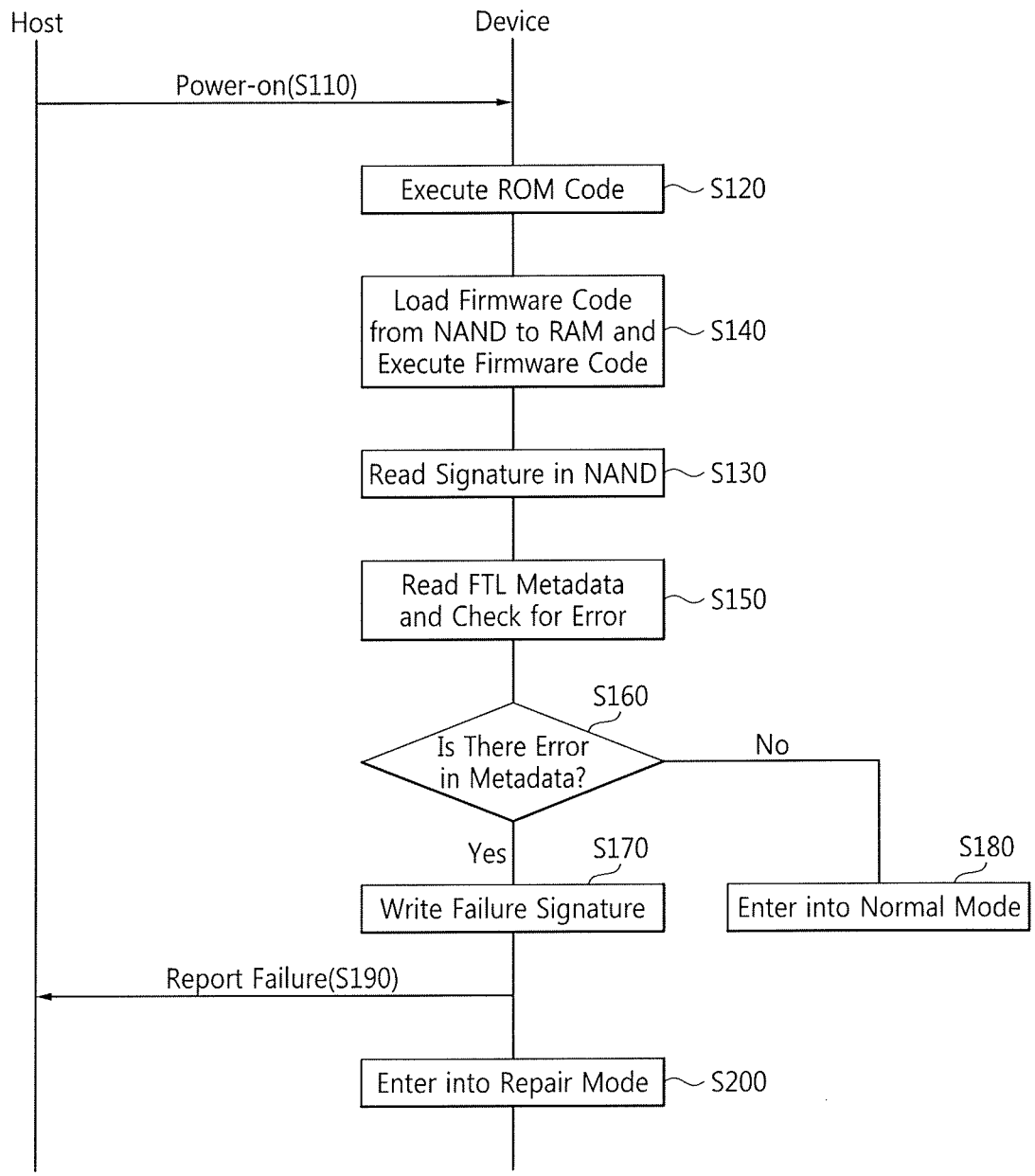
FIG. 7 is a flowchart of a method of repairing a storage device according to an exemplary embodiment of the inventive concept.

FIG. 7 is a flowchart of a method of repairing the storage device 200 according to an exemplary embodiment of the inventive concept. The method illustrated in FIG. 7 may be performed by the electronic system 10 illustrated in FIG. 1 or 3.

The method illustrated in FIG. 7 is the same as the method illustrated in FIG. 6 except for the order of operations S130 and S140. For example, when the ROM code is executed in operation S120, the firmware code stored in advance in the predetermined region in the non-volatile memory 250 (e.g., NAND flash memory 250) is loaded to the RAM 230 and is executed in operation S140. Then, the signature written to the signature address in the non-volatile memory 250 is read in operation S130.

As described above, the order of operations in a method of repairing the storage device 200 may be different in exemplary embodiments of the inventive concept.

For example, the order of operations may be the same as the orders illustrated in the exemplary embodiments of FIGS. 6 and 7, or the order may be different from the orders illustrated in the exemplary embodiments of FIGS. 6 and 7. Further, according to exemplary embodiments, additional operations may be added, or operations shown in FIGS. 6 and 7 may be omitted.

Figure 8:
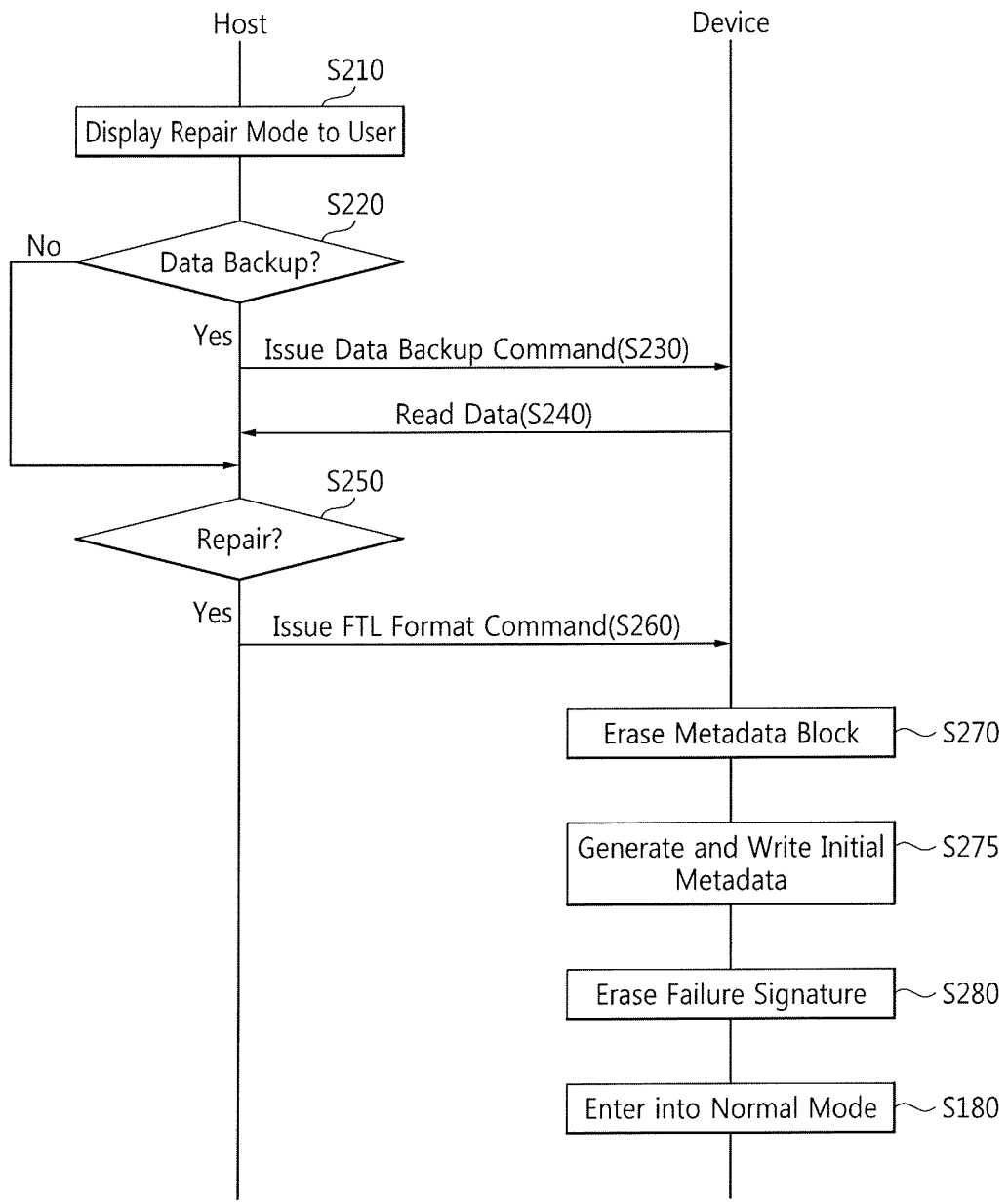
FIG. 8 is a flowchart of a method of operating an electronic system according to an exemplary embodiment of the inventive concept.

FIG. 8 is a flowchart of a method of operating the electronic system 10 according to an exemplary embodiment of the inventive concept. The method illustrated in FIG. 8 may be performed by the electronic system 10 illustrated in FIG. 1 or 3. Operations S210 through S280 illustrated in FIG. 8 may be performed after the storage device 200 reports the failure to the host 100 in operation S190 (see FIGS. 6 and 7).

Referring to FIG. 8, when receiving the failure report from the storage device 200 in operation S190, the repair application 102 in the host 100 may indicate to the user (e.g., by displaying a failure message to the user) that an error has occurred in the storage device 200 in operation S210. In addition, the repair application 102 may indicate to the user (e.g., display to the user) that the storage device 200 is in the repair mode in operation S210.

In operation S220, the repair application 102 may query the user to determine whether the user wishes to perform a data backup operation. When the user chooses to perform the data backup operation in operation S220, the repair application 102 issues a data backup command to the storage device 200 in operation S230. The storage device 200 reads and transmits user data from the non-volatile memory 250 (e.g., NAND flash memory 250) to the host 100 in response to the data backup command in operation S240. The host 100 may back up the data from the non-volatile memory 250 in another storage medium.

The repair application 102 may query the user to determine whether the user wishes to perform a repair operation in operation S250 (e.g., a user query may be issued to the user to determine whether to perform the repair operation). When the user chooses to perform the repair operation in operation S250, the repair application 102 issues an FTL format command to the storage device 200 in operation S260 (e.g., a device repair command is issued to the storage device 200 in response to the user query when the user query indicates that the user wishes to perform the repair operation). The storage device 200 may initialize the metadata in response to the repair command in operations S270 and S275. For example, referring to the initialization of the metadata, the storage device 200 may erase at least one block including the metadata in operation S270 and may generate and write initial metadata to the predetermined address in operation S275. In exemplary embodiments, the storage device 200 may erase memory blocks including user data as well as the memory block including the metadata.

After initializing the metadata in operations S270 and S275, the storage device 200 may erase/cancel the failure signature at the signature address in operation S280 and may enter into the normal mode in operation S180.

Figure 9:
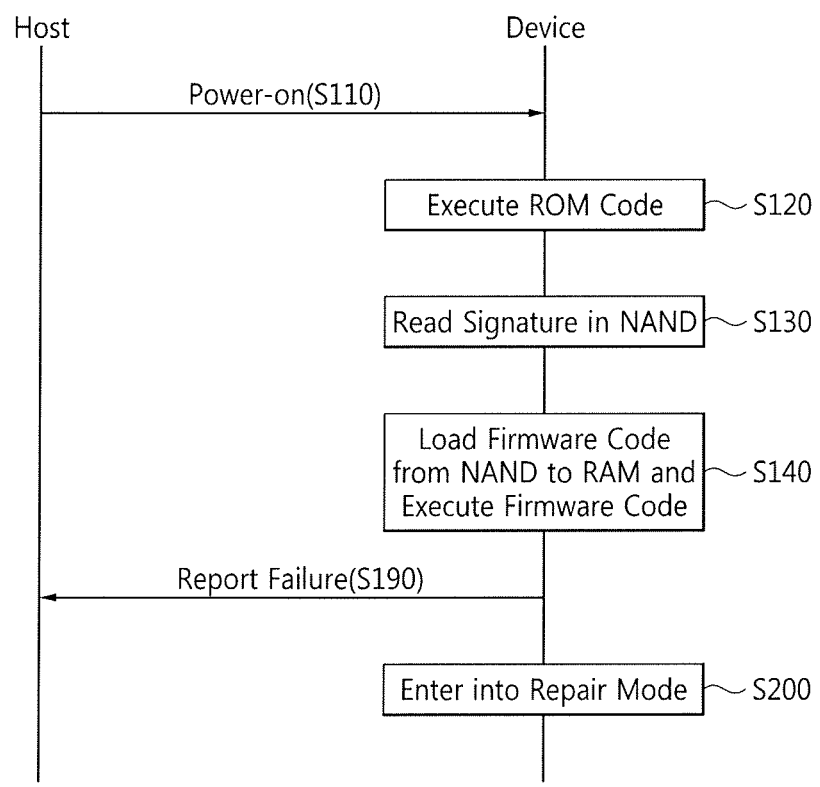
FIG. 9 is a flowchart of a method of repairing a storage device according to an exemplary embodiment of the inventive concept.

FIG. 9 is a flowchart of a method of repairing the storage device 200 according to an exemplary embodiment of the inventive concept. The method illustrated in FIG. 9 may be performed by the electronic system 10 illustrated in FIG. 1 or 3.

Referring to FIG. 9, when the storage device 200 is powered on in operation S110, the ROM code stored in the ROM 235 of the storage device 200 is first executed in operation S120. Once the ROM code has been executed, a signature written to the signature address of the non-volatile memory 250 (e.g., NAND flash memory 250) is read in operation S130.

The firmware code stored in advance in the predetermined region of the non-volatile memory 250 is loaded into the RAM 230 and executed in operation S140. Referring to the example described herein with reference FIG. 9, it is assumed that the signature read in operation S130 is a failure signature. At this time, the storage device 200 reports a failure to the host 100 without reading the FTL metadata from the non-volatile flash memory 250 in operation S190. The failure may be immediately reported to the host 100. The storage device 200 then enters into the repair mode in operation S200.

As described above, according to exemplary embodiments of the inventive concept, when an error occurs while the FTL metadata is being read after the firmware code is normally loaded from the storage device 200 to the RAM 230, a failure signature is written to a corresponding signature address. As a result, even when a power-off operation occurs during booting, the signature is read from the signature address during subsequent booting, and a determination regarding whether an error occurred during the previous booting can be checked. When it is determined that the failure signature has been written to the signature address, the storage device 200 may immediately report a failure to the host 100 without reading the metadata, and the storage device 200 enters into the repair mode.

According to exemplary embodiments of the inventive concept, a user is permitted to repair a non-volatile memory based storage device by himself/herself without having to visit a service center. As a result, the level of convenience for the user may be improved since the user does not have to visit a service center, and customer service workload for storage device manufacturers may be reduced, thereby reducing cost.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A method of repairing a storage device including a non-volatile memory, comprising:
    powering on the storage device;
    performing a booting sequence;
    determining whether an error has occurred during the booting sequence or during a normal mode;
    writing a failure signature to a predetermined signature address in the non-volatile memory upon determining that the error has occurred;
    reporting a failure to a host upon writing the failure signature;
    entering into a repair mode upon reporting the failure; and
    operating in the normal mode upon determining that the error has not occurred.

2. The method of claim 1, wherein performing the booting sequence comprises:
    executing a read-only memory (ROM) code that has been written to ROM;
    loading a firmware code from the non-volatile memory to random access memory (RAM); and
    reading flash translation layer (FM) metadata from the non-volatile memory,
    wherein determining whether the error has occurred comprises determining whether the error is present in the FTL metadata.

3. The method of claim 2, wherein entering into the repair mode comprises:
    receiving an FTL format command issued by a repair application program stored in the host;
    initializing the FTL metadata in response to receiving the FTL format command; and
    erasing the failure signature from the signature address.

4. The method of claim 3, wherein initializing the FTL metadata comprises:
    erasing at least one block comprising the FTL metadata; and
    generating and writing new initial metadata to a predetermined address.

5. The method of claim 3, wherein the FTL format command is one command from among a plurality of commands predefined in the repair application program, and the FTL command is a vendor specific command.

6. The method of claim 3, further comprising:
    entering into the normal mode after erasing the failure signature.

7. The method of claim 3, wherein the error is determined to he present in the FTL metadata upon determining that the FTL metadata is not found at a predetermined address, that an uncorrectable error has occurred in the FTL metadata, that the FTL metadata has a checksum error, or that a number of free blocks in the FTL, metadata is zero.

8. The method of claim , wherein the FTL: metadata comprises:
    mapping data used to perform a mapping operation between a logical address and a physical address, an attribute of a memory block indicating whether the memory block is a log block or a free block, and the number of free blocks.

9. The method of claim 2, further comprising:
    reading the failure signature or a success signature written to the predetermined signature address before loading the firmware code from the non-volatile memory to the RAM.

10. A method of operating an electronic system capable of repairing a storage device using an application program, the method comprising:
    power on the storage device;
    receiving a failure report from the storage device upon an error occurring during a booting sequence of the storage device or during a normal mode;
    displaying a failure message to a user in response to receiving the failure report;

issuing a user query to the user to determine whether to perform a repair operation; and issuing a device repair command to the storage device in response to the user query, wherein the error occurs in flash translation layer (FTL) metadata and the device repair command comprises an FTL format command.

11. The method of claim 10, wherein the FTL, format command is one command from among a plurality of commands predefined in the application program, and the FTL format command is a vendor specific command.

12. The method of claim 10, further comprising:

issuing a user query to the user, before issuing the FTL command to the storage device, to determine whether to perform a data backup operation; and issuing a data backup command to the storage device in response to the user query.

13. The method of claim 10, further comprising:

writing a failure signature, by the storage device, to a predetermined signature address upon the error occurring in the FTL metadata.

14. The method of claim 13, further comprising:

initializing the FTL metadata, by the storage device, in response to the FTL format command; and erasing the failure signature from the predetermined signature address.

15. A method of repairing a storage device including a non-volatile memory, comprising:

performing a booting sequence;

determining whether an error has occurred during the booting sequence;

erasing an existing failure signature from a signature address in the non-volatile memory upon determining that the error has not occurred;

writing a normal signature to the signature address upon determining that the error has not occurred;

writing a new failure signature to the signature address upon determining that the error has occurred;

reporting a failure to a host upon writing the new failure signature; and entering into a repair triode upon reporting the new failure.

16. The method of claim 15, further comprising operating in a normal mode upon determining that the error has not occurred.

17. The method of claim 15, wherein performing the booting sequence comprises:

executing a read-only memory (ROM) code that has been written to ROM;

loading a firmware code from the non-volatile memory to random access memory (RAM); and reading flash translation layer (FTL) metadata from the non-volatile memory, wherein determining whether the error has occurred comprises determining whether the error is present in the FTL metadata.

18. The method of claim 17, wherein entering into the repair mode comprises:

receiving an FTL format command issued by a repair application program stored in the host;

initializing the FTL metadata in response to receiving the FTL format command; and erasing the failure signature from the signature address.

19. The method of claim 18, wherein initializing the FTL metadata comprises:

erasing at least one block comprising the FTL metadata; and generating and writing new initial metadata to a predetermined address.

* * * * *